United States Patent [19]

Sakurada et al.

[11] Patent Number: 5,704,973

[45] Date of Patent: Jan. 6, 1998

[54] APPARATUS AND METHOD FOR THE UNIFORM DISTRIBUTION OF CRYSTAL DEFECTS UPON A SILICON SINGLE CRYSTAL

[75] Inventors: Masahiro Sakurada; Wataru Sato; Tomohiko Ohta, all of Fukushima-ken, Japan

[73] Assignee: Shin-Etsu Handotai Co., Ltd., Tokyo, Japan

[21] Appl. No.: 666,654

[22] Filed: Jun. 18, 1996

[30] Foreign Application Priority Data

Jun. 20, 1995 [JP] Japan ................... 7-152841

[51] Int. Cl.⁶ .................................................. C30B 15/20
[52] U.S. Cl. ............................. 117/15; 117/13; 117/208
[58] Field of Search ........................... 117/13, 14, 15, 117/201, 202, 203, 204, 208

[56] References Cited

U.S. PATENT DOCUMENTS

| | | | |
|---|---|---|---|
| 3,961,905 | 6/1976 | Rice | 117/204 |
| 4,158,038 | 6/1979 | Jewett | 117/204 |
| 5,264,189 | 11/1993 | Yamashita et al. | 117/204 |

FOREIGN PATENT DOCUMENTS

| | | |
|---|---|---|
| 0 308 308 | 3/1989 | European Pat. Off. . |
| 0 504 837 | 9/1992 | European Pat. Off. . |
| 0504837 | 9/1992 | European Pat. Off. ........... 117/204 |
| 39 05 626 | 8/1989 | Germany . |
| 44 42 239 | 6/1995 | Germany . |

*Primary Examiner*—Felisa Garrett
*Attorney, Agent, or Firm*—Wenderoth, Lind & Ponack

[57] ABSTRACT

Proposed is an improvement in the method and single crystal growing chamber for the preparation of a single crystal rod of silicon by the Czochralski method, according to which the distance between the surface of the melt of silicon contained in a crucible and the lower surface of the top wall of the crystal growing chamber is equal to or larger than the diameter of the crucible and the heat-insulating cylinder surrounding the crucible containing the melt of silicon and the heater has such a height as to reach the lower surface of the top wall of the chamber so as to keep the single crystal rod under growing is kept at a temperature not lower than 700° C. until reaching the lower surface of the top wall of the chamber thereby decreasing the density of the crystal defects of BMD type in the seed end of the single crystal rod as grown so that the uniformity in the distribution of BMD density is increased throughout the single crystal rod.

7 Claims, 3 Drawing Sheets

100
APPARATUS AND METHOD FOR THE UNIFORM DISTRIBUTION OF CRYSTAL DEFECTS UPON A SILICON SINGLE CRYSTAL

BACKGROUND OF THE INVENTION

The present invention relates to a method for the preparation of a silicon single crystal rod or, more particularly, to a Czochralski method for the preparation of a silicon single crystal rod with uniform distribution of crystal defects along the direction of the crystal growth as well as an apparatus therefor.

As is known, it is unavoidable that microscopic crystal defects are introduced into a silicon single crystal rod grown by the Czochralski method in the course of the crystal growth. In many cases, these microscopic defects are those derived mainly from oxygen precipitation and can be microscopically detected when a wafer taken from a silicon single crystal rod by slicing is subjected to a heat treatment for the oxygen precipitation followed by cleavage and the thus obtained cleaved surface is examined after preferential etching. These microscopic defects are called BMDs (bulk microdefects). These BMDs act as a gettering site in the manufacturing process of LSIs and play a role to take up various impurities introduced in the manufacturing process of the devices so as to keep cleanness of the surface areas for the formation of the device resulting in an increased yield of acceptable devices.

When the density of the BMDs is too large, on the other hand, adverse influences are caused also in the areas for the formation of the device resulting in the degradation of the performance of the device such as generation of a leakage current. When the density of the BMDs is too small, the above mentioned gettering effect cannot be high enough as a matter of course.

It is important, accordingly, that the density of the BMDs introduced into a single crystal rod of silicon in the course of crystal growth is adequately controlled to be not too high nor too low. The optimum density of the BMDs naturally depends on the types of the manufacturing procedures of the device, conditions of the heat treatment, degree of in-process contamination and so on so that the yield of acceptable silicon single crystal rods largely depends on whether or not the actually obtained density of the BMDs falls within the target range of the BMD density.

Nevertheless, the density of BMDs in a silicon single crystal rod grown by the Czochralski method widely differs between the head portion directly connected to the seed crystal and the tail portion even in one and the same silicon single crystal rod. For example, the density of BMDs in the head portion of a silicon single crystal rod is larger than in the tail portion usually by at least 100 times or, sometimes, by several thousands times. This fact leads to a problem that only a very small portion of a single crystal rod can meet the specific requirement relative to the density of BMDs greatly limiting the utilizability of a silicon single crystal rod. Various proposals and attempts have been made heretofore to solve this problem but no satisfactory solution of the problem has been obtained.

SUMMARY OF THE INVENTION

The present invention accordingly has an object to provide a novel and improved Czochralski method for the growth of a silicon single crystal rod to accomplish uniformity of the density distribution of the crystal defects or BMDs in a silicon single crystal rod grown by the Czochralski method in the direction of the crystal growth or the axial direction of the single crystal rod so as to greatly improve the utilizability of the silicon single crystal rod.

Thus, the method of the present invention for the preparation of a silicon single crystal rod by the Czochralski method comprises, in a first aspect of the invention, keeping the length of time, during which a silicon single crystal rod under the process of crystal growth passes through a region where the temperature is in the range from 600° C. to 700° C., not to exceed 80 minutes.

In a second aspect of the invention, the method of the invention for the preparation of a silicon single crystal rod by growing from the melt of silicon contained in a crucible held in a crystal growing chamber comprises keeping the temperature of the single crystal rod under growth leaving the surface of the melt at 700° C. or higher until arrival at the inner surface of the top wall of the crystal growing chamber.

In a third aspect of the invention, the method of the invention for the preparation of a silicon single crystal rod by growing from the melt of silicon contained in a crucible held in a crystal growing chamber comprises keeping the distance between the surface of the melt contained in the crucible and the inner surface of the top wall of the crystal growing chamber to be not smaller than the diameter of the crucible and keeping the temperature of the single crystal rod under growth leaving the surface of the melt until arrival at the inner surface of the top wall of the crystal growing chamber at 700° C. or higher.

The apparatus of the invention for the growth of a silicon single crystal rod by the Czochralski method comprises a heat-insulating cylinder which surrounds a crucible to contain a melt of silicon and a heater to melt the silicon in the crucible and has such a height as to reach the top wall of the crystal growing chamber.

Further, the crystal growing chamber of the inventive apparatus for the growth of a single crystal rod of silicon has such a height that the distance between the melt of silicon contained in a crucible and held inside of the chamber and the inner surface of the top wall of the chamber is not smaller than the diameter of the crucible in addition to the above mentioned feature relative to the height of the heat-insulating cylinder.

DETAILED DESCRIPTION OF THE PREFERRED EMBODIMENTS

Figure 1:
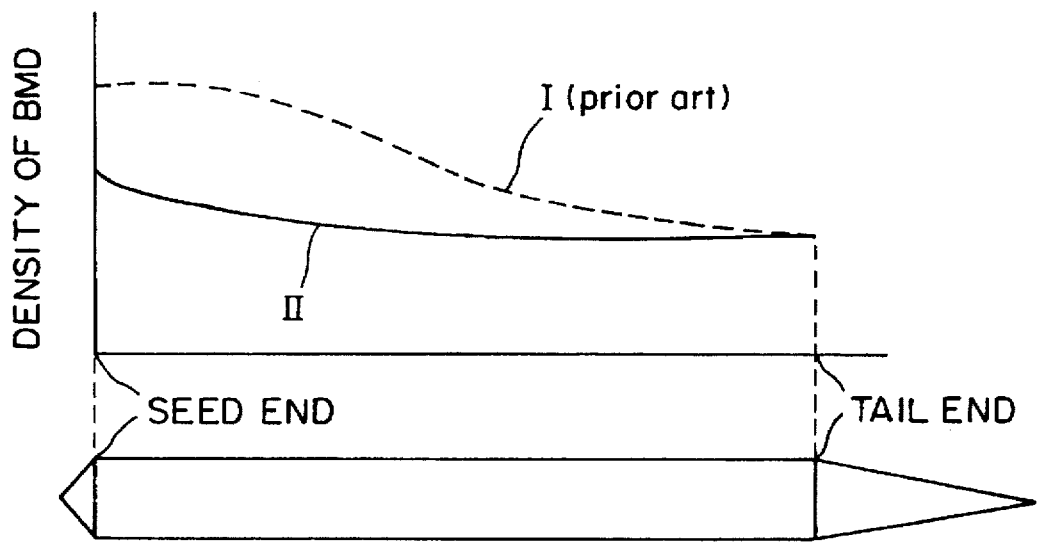
FIG. 1 is a graph showing distribution of the density of BMDs in a silicon single crystal rod along the direction of the single crystal growth.

As is shown in the graph of FIG. 1, the density of BMDs in a silicon single crystal rod grown by the Czochralski method has a distribution to be high at the end directly connected to the seed crystal, referred to as the seed end hereinafter, at the left end of the graph gradually decreasing toward the tail end at the right end of the graph. This phenomenon is presumably due to the difference in the thermal history which the seeding end and the tail end of the single crystal as grown have received in the course of the single crystal growth affecting the way and amount of the oxygen precipitation. This phenomenon, however, is more or less unavoidable in the manufacturing process of a silicon single crystal by the Czochralski method because it is absolutely impossible to have a completely identical thermal history for all portions of a silicon single crystal rod. Therefore, the silicon single crystal grown in a conventional crystal growing apparatus illustrated in FIG. 2A usually has a distribution of the BMD density shown by the broken line curve I of FIG. 1 rapidly decreasing from the seed end (left end of the graph) to the tail end (right end of the graph) of the single crystal rod so that the utilizability of a single crystal rod relative to the number of wafers having a BMD density falling within a target range to be taken from the single crystal rod is limited.

In view of the fact that the thermal history given to a single crystal rod of silicon in the course of crystal growth can never be identical between the seed end and the tail end, the inventors have come to an idea that the silicon single crystal rod under growth is kept at a temperature of 700° C. or higher until the growing single crystal leaving the surface of the silicon melt in the crucible reaches the top wall of the crystal growing chamber so as to be able to avoid the temperature range of 600° to 700° C. where the oxygen precipitation is most deeply affected.

While it is known and generally accepted that the amount of oxygen precipitation in a silicon single crystal rod grown by the Czochralski method is greatly increased by subjecting the single crystal rod to a heat treatment at a temperature of 600° C. to 700° C. (see, for example, "Silicon" by T. Abe, page 195, published by Baifukan Publishing Co., 1994). Namely, it is natural that the density of BMDs is increased with a large amount of the oxygen precipitation in the seed end of a silicon single crystal rod which has taken a longer time for passing through this temperature range than the tail end. Accordingly, the length of time taken by the seed end of a single crystal rod to pass through the temperature range of 600° C. to 700° C. could be shortened when the single crystal rod under growing in the crystal growing chamber is kept at a temperature not lower than 700° C. and then rapidly cooled after arrival at the top wall of the crystal growing chamber so that the lengths of time taken by the seed end and the tail end to pass through the temperature range of 600° C. to 700° C. can be approximately identical.

Figure 2A:
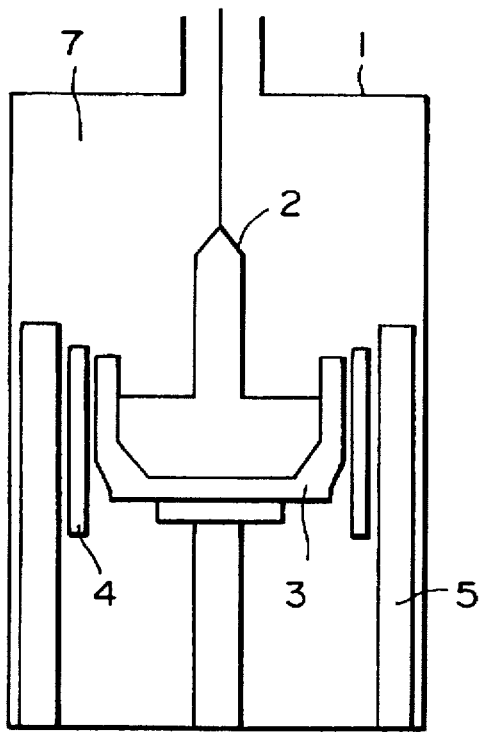
FIG. 2A is a schematic illustration of the inside structure of a conventional single crystal growing apparatus by a vertical axial cross sectional view.
Figure 2B:
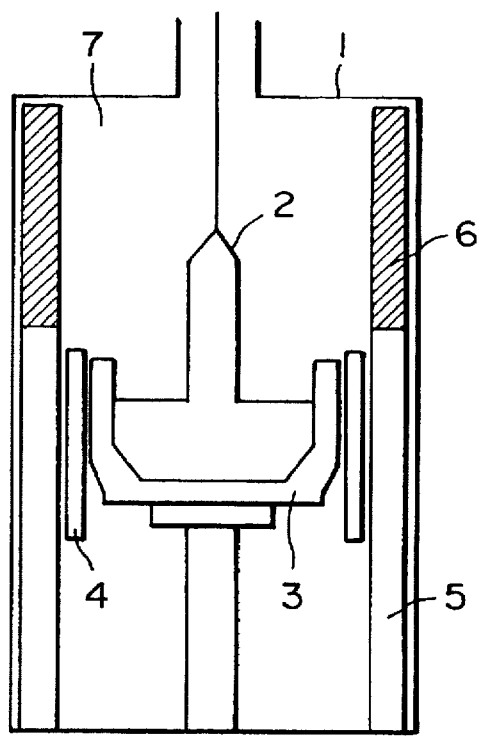
FIG. 2B is a schematic illustration of the inside structure of the inventive single crystal growing apparatus by a vertical axial cross sectional view.

With this fact kept in mind, the inventors conducted a numerical calculation to make an estimation of the thermal history of a single crystal rod grown in crystal growing chambers of different structures relative to heat insulation leading to a conclusion that the length of time taken by a silicon single crystal rod under growing to pass through the temperature range of 600° C. to 700° C. can be shortened when the crystal growing chamber has a structure as shown in FIG. 2B. In this chamber, in contrast to the conventional crystal growing chamber illustrated in FIG. 2A, the heat-insulating cylinder 5 surrounding the heater 4 is provided with an extension 6 to reach the top wall 1 of the crystal growing chamber so as to accomplish heat-keeping in the upper zone of the chamber and to decrease dissipation of heat by radiation from the surface of the single crystal rod 2 under growth thereby preventing decrease of the temperature of the single crystal rod 2 leaving the surface of the silicon melt contained in a crucible 3 from being lower than 700° C. until reaching the top wall 1 of the chamber.

On the other hand, the heat-insulating cylinder 5 in the conventional chamber illustrated in FIG. 2A does not reach the top wall 1 of the crystal growing chamber allowing dissipation of heat from the single crystal rod 2 going out of the heat-insulating cylinder 5 so that cooling of the single crystal rod 2 is promoted from above. Accordingly, the temperature of the upper part of a single crystal rod under pulling up already becomes lower than 700° C. while the single crystal is still within the chamber. As a consequence, the length of time taken by the seed end of the single crystal rod to pass through the temperature range of 600° C. to 700° C. is necessarily longer than the time taken by the tail end of the single crystal rod 2 to cause a non-uniform distribution of the BMD density within a single crystal rod 2.

The upward extension of the heat-insulating cylinder 5 can be accomplished by merely extending the conventional heat-insulating cylinder 5 upwardly necessarily to reach the lower surface of the top wall 1 of the crystal growing chamber. It is sufficient to have the upper end of the extension 6 in the vicinity of the lower surface of the top wall 1 leaving a gap of a few centimeters without requiring actual direct contacting thereof with the top wall 1 of the chamber provided that the single crystal rod under growth can be kept at a temperature of 700° C. or higher until the single crystal rod 2 reaches the top wall 1 of the chamber.

Figure 4:
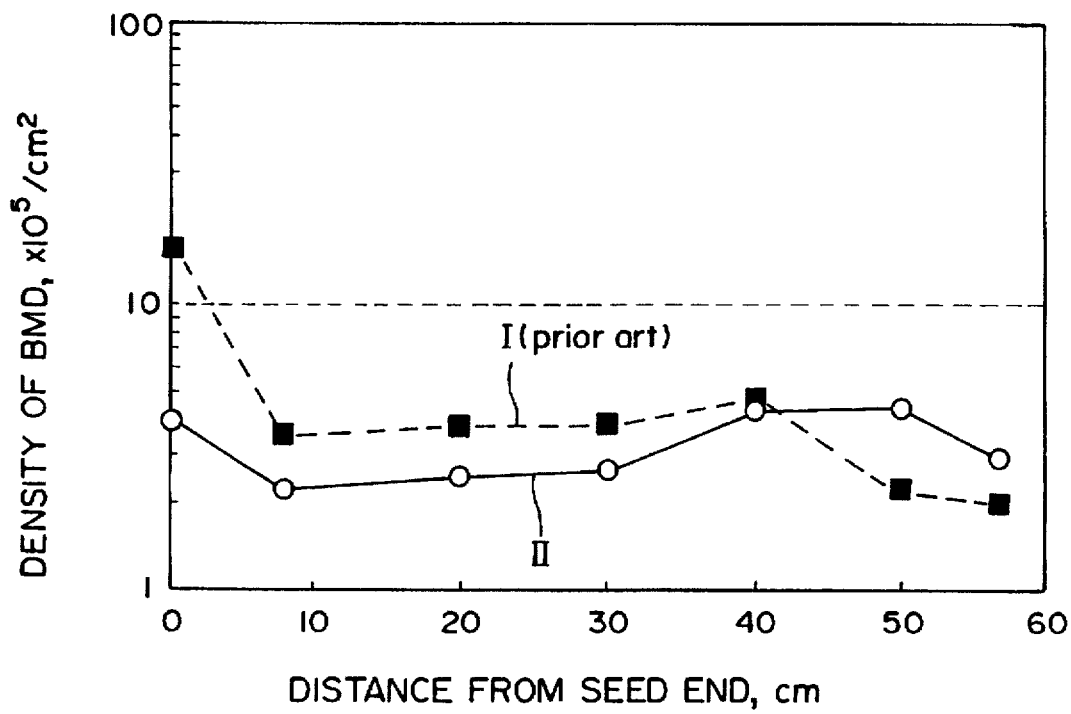
FIG. 4 is a graph showing the density distribution of BMDs along the direction of the crystal growth in silicon single crystal rods obtained in two crystal growing apparatuses having different ratios of the crucible diameter and the height from the melt surface to the top wall of the chamber.

It is also preferable to have the distance from the surface of the silicon melt in the crucible 3 and the lower surface of the top wall 1 of the crystal growing chamber larger than the diameter of the crucible 3. This is because, when the distance from the surface of the silicon melt in the crucible and the lower surface of the top wall 1 of the chamber is sufficiently long, the region where the temperature of the growing single crystal rod 2 is not decreased to 600° to 700° C. can also be long and the growing single crystal rod 2 is thereafter cooled down rapidly at the top of the chamber so that the length of time taken to pass through the temperature region of 600° to 700° C. can be shortened leading to suppression of increase in the BMD density in the seed end. When the distance from the surface of the silicon melt in the crucible 3 and the lower surface of the top wall 1 of the chamber is smaller than the diameter of the crucible 3, on the other hand, the temperature of the top wall 1 of the chamber is necessarily increased to decrease the effect of rapid cooling at the top of the chamber and the length of time taken by the growing single crystal rod 2 to pass through the temperature region of 600° to 700° C. is increased. FIG. 4 shows the density distribution of BMDs along the axial direction of silicon single crystal rods grown in an apparatus in which the distance H between the surface of the silicon melt in the crucible and the chamber top to the diameter D of the crucible, i.e. H:D, was 0.9 (curve I) and in an apparatus in which the H:D ratio was 1.2 (curve II).

Figure 3A:
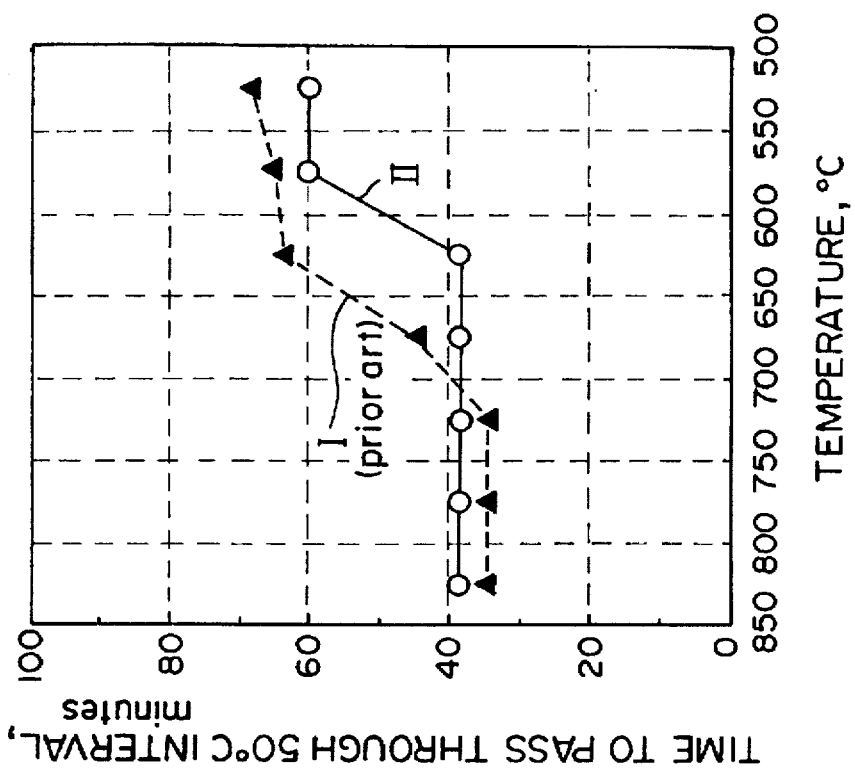
FIG. 3A is a graph showing the temperature of a silicon single crystal rod under growing as a function of the distance from the surface of the silicon melt and FIG. 3B is a graph show the length of time taken by a silicon single crystal under growth passing through temperature ranges each of a 50° C. width.
Figure 3B:
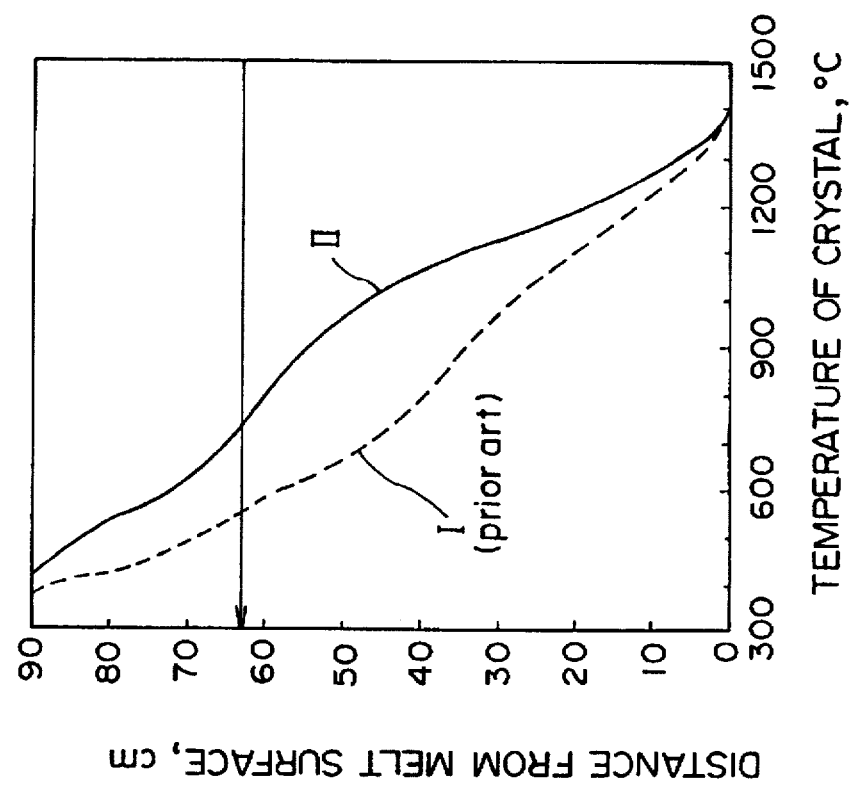

A silicon single crystal rod was grown by using crystal growing chambers having the above mentioned conventional and inventive structures illustrated in FIGS. 2A and 2B, respectively, and the temperature distribution was measured to give a result as is shown in FIG. 3A, in which the horizontal arrow indicates the position of the chamber top, by the curves I and II for the conventional and inventive chambers, respectively, that the temperature could be kept at 700° C. or higher in the region between the surface of the melt in the crucible 3 and the top wall 1 of the chamber so that the length of time taken by the seed end of the growing single crystal rod 2 to pass through the temperature region of 600° to 700° C. could be reduced not to exceed 80 minutes as compared with the corresponding length of time of 100 minutes or longer in a conventional crystal growing chamber as is shown in FIG. 3B by the curves I and II for the single crystal rods growing in the conventional and inventive chambers, respectively. The density of BMDs in a silicon single crystal rod had a distribution as shown by the solid line curve I in FIG. 1 indicating a substantial decrease in the BMD density in the seed end of the single crystal rod and increased uniformity of the BMD density throughout the single crystal rod from the seed end to the tail end.

In the following, the inventive method and apparatus are illustrated in more detail by way of an Example and a Comparative Example.

Example and Comparative Example

Figure 5:
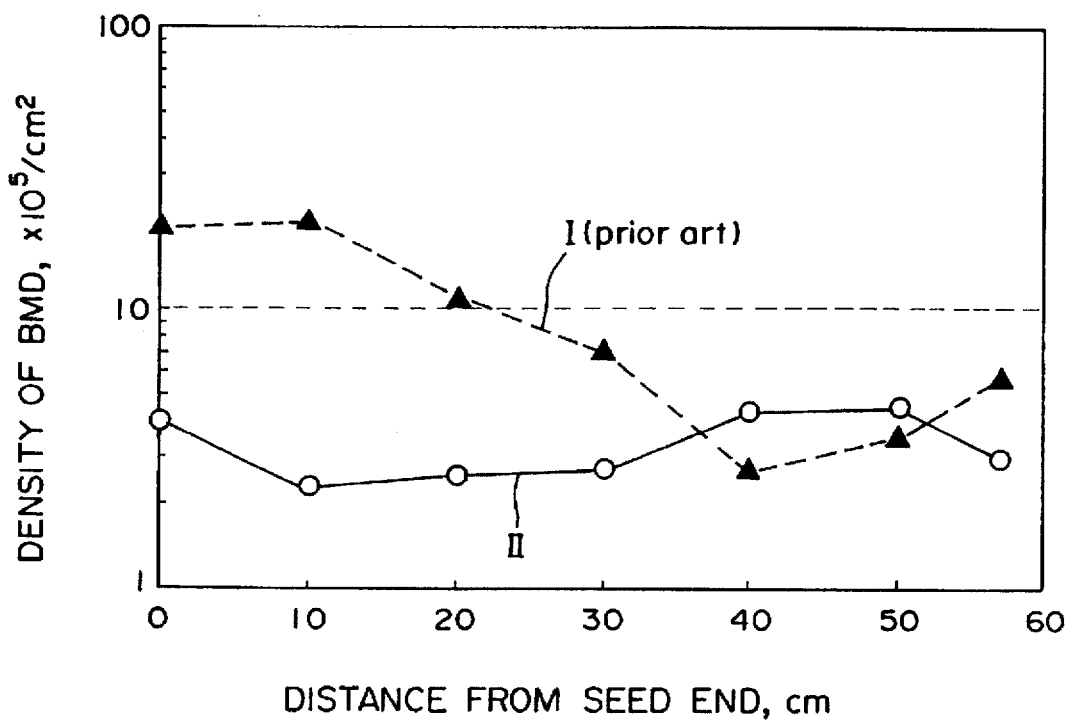
FIG. 5 is a graph showing the density distribution of BMDs along the direction of the crystal growth in silicon single crystal rods obtained in an inventive Example and in a Comparative Example.

A fused silica glass crucible of 18-inch diameter was charged with 50 kg of polycrystalline silicon blocks as the starting material and a silicon single crystal rod of a crystallographic axial orientation of <100> having a diameter of 6 inches was grown by the Czochralski method. Two types of crystal growing chambers were used including the conventional chamber illustrated in FIG. 2A and the chamber according to the invention illustrated in FIG. 2B in which the region from the surface of the silicon melt in the crucible 3 to the lower surface of the top wall 1 of the chamber could be kept at a temperature of 700° C. or higher. Each of the single crystal rods thus obtained was subjected to the measurement of the density of BMDs from the seed end to the tail end to give the results shown in FIG. 5 by the curves I and II for the single crystal rods grown in the conventional and inventive chambers, respectively. As is clear from the graph of FIG. 5, the single crystal rod obtained in the inventive crystal growing chamber had a decreased BMD density in the seed end to accomplish an approximately uniform distribution of the BMD density in the direction of the crystal growth as indicated by the curve II as compared with the curve I.

The measurement of the BMD density was carried out in the following manner. Thus, wafers having a thickness of about 1 mm were prepared by slicing the straightly cylindrical portion of the single crystal rod and the wafers were subjected to a heat treatment at 800° C. for 4 hours and then at 1000° C. for 16 hours in an atmosphere of oxygen and the cleaved surface of the wafer was subjected to a preferential etching treatment followed by counting of BMDs using an optical microscope by scanning in the radial direction.

What is claimed is:

1. In a method for the preparation of a silicon single crystal rod by the Czochralski method, the improvement which comprises keeping the length of time taken by a silicon single crystal rod under the process of growth to pass through a region where the temperature is in a range from 600° C. to 700° C. does not exceed 80 minutes.

2. In a method for the preparation of a silicon single crystal rod by the Czochralski method from a melt of silicon contained in a crucible held in a crystal growing chamber, the improvement which comprises keeping the single crystal rod under growth leaving the surface of the melt until reaching the lower surface of the top wall of the crystal growing chamber at a temperature of 700° C. or higher.

3. In a method for the preparation of a silicon single crystal rod by the Czochralski method from a melt of silicon contained in a crucible held in a crystal growing chamber, the improvement which comprises keeping a distance between the surface of the melt of silicon contained in a crucible and the lower surface of the top wall of the crystal growing chamber to be equal to or larger than the diameter of the crucible and keeping the single crystal rod under growth leaving the surface of the melt of silicon until reaching the lower surface of the top wall of the crystal growing chamber at a tem-perature of 700° C. or higher.

4. In a single crystal growing chamber for the preparation of a single crystal rod of silicon by the Czochralski method from a melt of silicon contained in a crucible heated by means of a heater, the improvement which comprises that a heat-insulating cylinder, which surrounds the crucible containing the melt of silicon and the heater to melt the silicon in the crucible, is provided, the heat-insulating cylinder having such a height as to reach a lower surface of a top wall of the crystal growing chamber.

5. In a single crystal growing chamber for the preparation of a single crystal rod of silicon by the Czochralski method from a melt of silicon contained in a crucible heated by means of a heater, the improvement which comprises that the distance between the surface of a melt of silicon contained in the crucible and the lower surface of the top wall of the crystal growing chamber is equal to or larger than the diameter of the crucible and a heat-insulating cylinder, which surrounds the crucible containing the melt of silicon and the heater to melt the silicon in the crucible, is provided, the the heat-insulating cylinder having such a height as to reach the lower surface of the top wall of the crystal growing chamber.

6. In a single crystal growing chamber for a preparation of a single crystal rod of silicon by the Czochralski method from a melt of silicon contained in a crucible heated by means of a heater, the improvement which comprises that a heat-insulating cylinder, which surrounds the crucible containing the melt of silicon and a heater to melt the silicon in the crucible, is provided, the heat-insulating cylinder having such a height as to reach a lower surface of the top wall of the crystal growing chamber so as to keep a region between a surface of the melt of silicon contained in the crucible and the lower surface of the top wall of the chamber at a temperature of 700° C. or higher.

7. In a single crystal growing chamber for the preparation of a single crystal rod of silicon by the Czochralski method from a melt of silicon contained in a crucible heated by means of a heater, the improvement which comprises that the distance between a surface of the melt of silicon contained in the crucible and a lower surface of a top wall of the crystal growing chamber is equal to or larger than the diameter of the crucible and a heat-insulating cylinder, which surrounds the crucible containing the melt of silicon and the heater to melt the silicon in the crucible, is provided, the heat-insulating cylinder having such a height as to reach the lower surface of the top wall of the crystal growing chamber so as to keep a region between the surface of the melt of silicon contained in the crucible and the lower surface of the top wall of the chamber at a temperature of 700° C. or higher.

* * * * *